Sept. 6, 1955 W. G. PFANN 2,717,342

SEMICONDUCTOR TRANSLATING DEVICES

Filed Oct. 28, 1952

INVENTOR
W. G. PFANN
BY Edwin B. Cave
ATTORNEY

United States Patent Office 2,717,342

Patented Sept. 6, 1955

2,717,342

SEMICONDUCTOR TRANSLATING DEVICES

William G. Pfann, Basking Ridge, N. J., assignor to Bell Telephone Laboratories, Incorporated, New York, N. Y., a corporation of New York Application October 28, 1952, Serial No. 317,191

3 Claims. (Cl. 317—235)

This invention relates to semiconductor translating devices and more particularly to such devices having a multiplicity of emitter electrodes.

The devices herein described all contain at least two signal input electrodes. Some of the elements may be used to replace two or more three-electrode semiconductor devices where each is to be operated independently and not simultanously. In others it is possible to insert two signals simultaneously in such a manner that the effect will be cumulative or subtractive. In the latter type of device, it is possible to control the geometry of the element so that any desired phase relationship between input signals may be brought about.

In one embodiment of this invention the device is of a filamentary form and contains two independent emitter electrodes. Filamentary semiconductor translating devices having a single emitter are disclosed in Patent No. 2,502,479 which issued April 4, 1950 and in Patent No. 2,560,594, issued July 17, 1951.

Generally, the devices to be described are of the filamentary type having typical over-all dimensions of .005 x .005 x .025 inch. Elements constructed of semiconductor material of uniform conductivity type will be described. Such a device may be operated as a reversible transistor. Elements constructed of semiconductor material containing one or more PN transition areas will also be described. Such elements are bilateral in the sense that they will amplify signals applied to one or another set of input terminals or to both sets of input terminals simultaneously.

All of the semiconductor devices to be described may be constructed of any semiconductor material which exhibits the characteristics of extrinsic conductivity. Examples are materials selected from the fourth group of the Periodic Table according to Mendeleyeev such as silicon and germanium. Such materials depend on the presence of minute quantities of significant impurities for their semiconductive properties. Where devices constructed of such materials are described, it is understood that such significant impurities are present in sufficient degree to bring about the desired characteristics. Where the semiconductor chosen is silicon or germanium, significant impurities producing N-type conduction are phosphorus, arsenic, antimony and bismuth, selected from group V and significant impurities producing P-type conduction are boron, aluminum, gallium and indium, selected from group III, both from the same periodic table. All of the devices to be described include two large-area or otherwise low-resistance electrodes, one of which serves as base and the other as collector although these functions are interchangeable or synonymous and at least two rectifying electrodes which may be point contacts or bonded points. As will be described, additional PN boundaries may be substituted for point electrodes.

For a theoretical discussion of the physical theory of the filamentary type of transistor, attention is directed to Electrons and Holes in Semiconductors by W. Shockley (D. Van Nostrand, New York, 1950) chapter 4, section 4.1 and to the Bell System Technical Journal, volume 28 (July, 1949) pages 344 to 366 in an article by W. Shockley, G. L. Pearson and J. R. Haynes entitled "Hole Injection in Germanium—Quantitative Studies and Filamentary Transistors."

The invention can be better understood by reference to the following drawings, in which.

Referring again to Fig. 1, the device depicted is a reversible bridge transistor similar to that discuseed by W. Shockley in his book above cited, but differing in the inclusion of an additional emitter. It consists of a relatively long, thin filament of semiconductor 1 with large-area contacts 2 and 3 at either end and two point-type emitter electrodes 4 and 5, each making rectifying contact near one of large-area electrodes 2 and 3. Such a transistor in conjunction with a suitable means for switching bias voltage is capable of acting as a reversible or two-way amplifier. The connections to the respective large-area electrodes 2, 3 and point-type electrodes 4, 5 for each transmission direction are as follows:

*Table I*

| Transmission Direction | Base | Emitter | Collector |
|---|---|---|---|
| A | 2 | 4 | 3 |
| B | 3 | 5 | 2 |

In either transmission direction A or B, the device operates in accordance with the disclosure contained in United States Patent No. 2,502,479.

Figure 2:
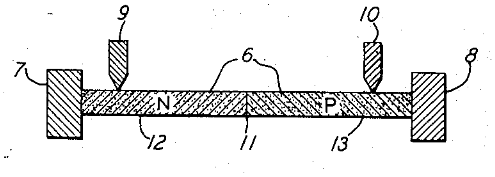
Fig. 2 is a schematic cross-sectional view of a device similar to that of Fig. 1 but containing a PN transition region between the two point-type contacts.

The device depicted in Fig. 2 is illustrative of that type of element which will be herein referred to as a bilateral transistor. It also consists of a relatively long, thin filament of semiconductor 6, two large-area contacts, one at either end, numbered 7 and 8 and two point-type rectifying electrodes 9 and 10, each of which is close to one of end electrodes 7 and 8. Body 6, however, contains a PN transition region 11 so that there is an N-type region 12 and a P-type region 13. As will be discussed, it is not necessary to alter the biasing circuit of such a device in order to change input circuits. Therefore, it is possible to feed two distinct signals into this device simultaneously, one utilizing electrode 9 as emitted, 7 as base, and 8 as collector, and the other utilizing 10 as emitter, 8 as base, and 7 as collector. Due to the nature of this device and since conduction in one circuit is by means of P-type carriers and in the other by means of N-type carriers, it is seen that considering this factor independently and disregarding transit times, the outputs of the two circuits will be 180 degrees out of phase if the two input signals are in phase. It follows that properly inserting two signals 180 degrees out of phase into the two emitter circuits results in a cumulative signal across a common load. One signal is shifted 180 degrees while the phase of the other remains substantially unchanged.

It is possible to further modify the phase relationship of the outgoing signals by means of slight variations in the geometry of the device shown in Fig. 2. This is due to the very appreciable time lapse which occurs by reason of the time that it takes the injected carriers to traverse the device. In this connection attention is directed to two articles, one by J. R. Haynes and W. C. Westphal which appears in the Physical Review, volume 85, page 680 and the other by J. R. Haynes and W. Shockley which appears in the Physical Review, volume 81, page 835. These articles report experimental findings relating to the mobility rates of the two types of injected minority carriers in silicon and in germanium.

From the above-cited references it is seen that in germanium the transit time of injected holes is approximately 2.1 times as great as for injected electrons, while in silicon the ratio is reported to be more nearly 5:1. By utilizing these relationships in the design of a device such as that depicted in Fig. 2, and by regulating the distances between boundary 11 and emitter electrodes 9 and 10, it is possible to alter the phase relationship between the outgoing signals. For example, in germanium, if it is desired to bring two signals 180 degrees out of phase in phase across a common load, it is necessary that N region 12 between point contact 9 and PN boundary 11 be approximately one-half as long as that portion of the P region between boundary 11 and electrode 10 since the injected holes travel one-half as quickly in region 12 as the injected electrons do in region 13 where the resistivities of N and P regions 12 and 13 are equal.

Figure 1:
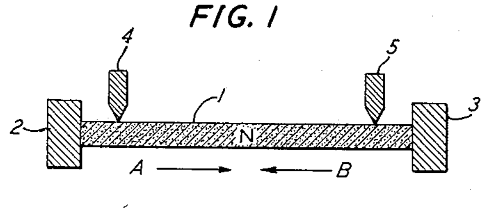
Fig. 1 is a schematic cross-sectional view of a filamentary device constructed in accordance with this invention having two large-area contacts and two point-type contacts.
Figure 3:
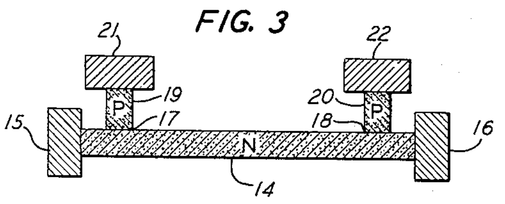
Fig. 3 is a schematic cross-sectional view of a device having characteristics similar to those of the device of Fig. 1 but making rectifying contact through two PN transition regions.

The device of Fig. 3 has characteristics which are similar to those for the device of Fig. 1. This element also has an elongated body 14 of uniform conductivity type and two large-area electrodes 15 and 16, one at either end. Rectifying contacts 4 and 5 of the device of Fig. 1 have here been replaced by PN boundaries 17 and 18 so that the device contains, in addition to semiconductor portion 14, two semiconductive portions 19 and 20 of a conductivity type opposite to that of body 14. Contact is made to these two regions 19 and 20 by means of large-area contacts 21 and 22 which are of a construction similar to that of electrodes 15 and 16. The element depicted in Fig. 3 is reversible in that with proper switching means for changing bias, signal input terminals may be emitter contact 21 and base contact 15 with 16 the collector, or emitter 22 and base 16 with electrode 15 as collector.

Figure 4:
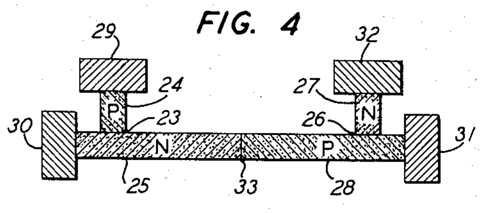
Fig. 4 is a schematic cross-sectional view similar to the device of Fig. 3 except that it contains three PN transition regions, one for each of the rectifying electrodes and one in the body of the device.

The device of Fig. 4 bears the same relationship to that of Fig. 2 as the device of Fig. 3 does to that of Fig. 1. Here, point contact 9 of Fig. 2 has been replaced by PN junction 23 which is the transition region between P-type region 24 and N-type region 25. Point contact 10 has been replaced by junction 26 which is the transition region between N region 27 and P region 28. Electrical contact to regions 24, 25, 27 and 28, is through large-area electrodes 29, 30, 32 and 31. PN boundary 33 is the junction of regions 25 and 28. Such a device performs all the functions of the device shown in Fig. 2.

Figure 5:
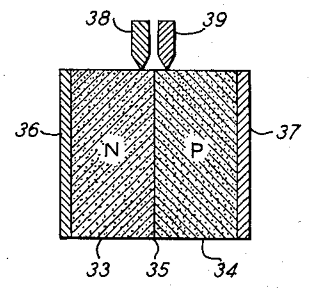
Fig. 5 is a schematic cross-sectional view of a non-filamentary structure alternative to the device of Fig. 2.

In Fig. 5 there is shown a PN junction transistor similar to the type described and claimed in United States Patent No. 2,502,488, issued April 4, 1950. With its added point-type electrode, however, the device is a four-electrode PN junction transistor which, although non-filamentary, will perform some of the functions of the devices depicted in Figs. 2 and 4. Since, however, efficient action of the device of Fig. 5 is dependent upon the injection of carriers close to barrier 35 through emitter 38 or 39, the dissimilarity of transit times in the N and P regions 33 and 34 do not have an appreciable effect on the phase relationship of the outgoing signals. For this reason it is not practical to regulate the distances between barrier 35 and emitters 38 and 39 to obtain a desirable phase relationship. For all practical purposes inserting signals 180 degrees out of phase results in the addition of in-phase output signals across a common load.

The device as depicted in Fig. 5 consists of N and P regions 33 and 34 on either side of junction 35, large-area electrodes 36 to N region 33 and 37 to P region 34, and two emitter points 38 and 39 straddling PN boundary 35. For minimum recombination of generated hole-electron pairs between emitter point 38 or 39 and junction 35, it is advisable to keep these points close to junction 35 at a distance in the range of a very few mils. Since it is not necessarily intended that emitter points 38 and 39 interact in any way, they may be widely spaced along the barrier so long as the distance of each from the barrier itself is kept at a minimum. There is one dimension consideration aside from the spacing of the two emitter points 38 and 39 from junction 35. Increasing the cross-sectional area of the plane of junction 35 increases the power dissipation and, therefore, the current carrying capacity of the device. Typical dimensions of this plane may be of the range of one-tenth of an inch in each direction. It is understood that either or both of emitter points 38 and 39 may be replaced by gold bonded points as described in an article by G. L. Pearson in volume 27 of the Bulletin of the American Physical Society at page 14, or by additional junctions and large-area contacts similar to portions 23, 24 and 29 or 26, 27 and 32 of the device of Fig. 4. For further information on the theoretical considerations to be taken into account in the design of devices utilizing this type of transistor action, attention is directed to the above-cited United States Patent No. 2,502,488, granted April 4, 1950.

Figure 6:
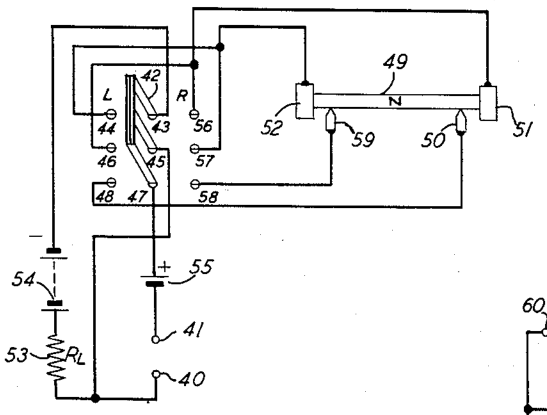
Fig. 6 is a circuit diagram containing a switching arrangement allowing one or the other of the inputs of a device, such as that shown in Fig. 1 and Fig. 3, to be used alternatively.

Fig. 6 shows a reversible bridge transistor of the type discussed in connection with Fig. 1 together with suitable switching means for switching bias voltages so that it may be caused to amplify selectively in one direction or the other. In this circuit a signal is inserted across contacts 40 and 41. With switch 42 in a left-hand position L so that contacts 43—44, 45—46 and 47—48 are interconnected, the signal is caused to pass into element 49 across point-type electrode 50 acting as emitter and large-area electrode 51 acting as base so that the amplified signal is taken out across base 51 and collector 52, and is impressed across load 53. By means of biasing battery 54, collector 52 is kept negative in respect to base 51 and by means of biasing battery 55, emitter 50 is biased positively in respect to base 51 and collector 52. With the switch 42 thrown into the right-hand position R so that points 43—56, 45—57, and 47—58 are interconnected, the entire biasing arrangement is reversed so that the signal input is now across emitter 59 and base 52 and an amplified signal is taken out across base 52 and collector 51. Use of such a device in the circuit of Fig. 6 results in almost identical equivalent circuit characteristics in either transmission direction. With such an arrangement α values varying by 5 per cent or less in either direction are obtained.

The general aspects of the bilateral bridge transistor such as the devices of Figs. 2 and 4 will be discussed in connection with the circuit of Fig. 7. It is understood that the device of Fig. 5 may be substituted for either of these devices providing certain biasing conditions are taken into account, although the phase picture will be different as has been discussed.

Figure 7:
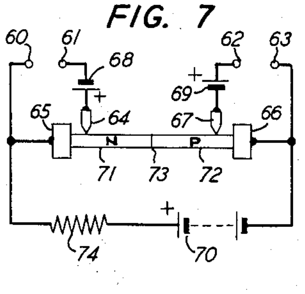
Fig. 7 is a circuit diagram by means of which a device such as that shown in Fig. 2 or Fig. 4 may be used to amplify two signals simultaneously and to produce the amplified signal in a common load.

In Fig. 7 two signals are introduced, one across contacts 60 and 61, the second across contacts 62 and 63. In the arrangement shown in the circuit of Fig. 7, the first signal which is introduced across 60 and 61 utilizes point emitter 64, base 65 and collector 66, while the second signal utilizes 67 as emitter, 66 as base, and 65 as collector. By means of biasing battery 68, emitter 64 is at all times biased positively in respect to base 65. Battery 69 biases electrode 67 negatively with respect to base 66. Battery 70 maintains electrode 65 at a higher potential than that of 66. The device itself is constructed in accordance with the description of Fig. 2 and consists of, in addition to the portions already discussed, N region 71, P region 72 on either side of junction 73. A cumulative signal is brought out across load 74.

The operation of the device is as follows: With zero current in each emitter 64 and 67 the current in the load is $$I=\frac{E}{R_{74}+R_{71}+R_{73}+R_{72}}$$

where $E$=the voltage impressed by means of battery 70
$R_{74}$=the resistance of the load
$R_{71}$=the resistance of the N region
$R_{73}$=the resistance of the PN junction
$R_{72}$=the resistance of the P region.

The units of I, E and R are, respectively, amperes, volts and ohms. $R_{71}$ and $R_{72}$ are moderately large due to the relatively small cross-section of these regions and $R_{73}$ is considerable being equal to the reverse resistance of PN barrier 73. Injection of holes at emitter 64 reduces $R_{74}$ and $R_{73}$ thereby causing a substantial change in the total resistance of the bridge. Injection of electrons at emitter 67 reduces $R_{72}$ and $R_{73}$ in a similar manner.

Thus in a single bridge with a single collector bias voltage there are several kinds of transistor amplifying effects occurring simultaneously where both emitters are in operation. These are:

(*a*) N-type bridge effect
(*b*) P-type bridge effect
(*c*) collection of holes and electrons from two separate low resistance emitters by a single high resistance PN boundary.

The effects of the two signals are additive in the load and are independent except for the increase in field in one region caused by the collection of carriers injected by the emitter at the opposite region. Holes injected at emitter 64 and traveling through region 71 across PN boundary 73 into region 72 and passing through the latter region increase the field which in turn acts on electrons injected at emitter 67.

The methods by which the devices of the present invention can be manufactured have been fully disclosed elsewhere. For details on the construction of bridge transistors of the type herein disclosed, attention is directed to the sandblasting method described in United States Patent 2,560,594 and the supersonic vibrator method described by W. L. Bond in American Physical Society Bulletin, volume 25, page 16 entitled "Technique of Cutting Germanium Filaments." In addition, filaments may be formed by preferential etch methods as, for example, by masking the desired portion with wax or other material and allowing a suitable etch to eat through the remaining material. It is understood that point contacts and bonded points may be constructed, for example, according to G. L. Pearson's article above cited. Surface treatments include etching the surface to which point contact is to be made, for example, by superoxol etch (see United States Patent No. 2,542,727, issued December 29, 1949), or the etch disclosed in the copending application of R. D. Heidenreich, Serial No. 164,303, filed May 25, 1950, and further may include a surface treatment for the purpose of increasing the lifetime of generated carriers such as the antimony oxichloride treatment described in the copending application of J. R. Haynes, Serial No. 175,648, filed July 24, 1950. Construction details for the device depicted in Fig. 5 are contained in United States Patent No. 2,502,488, issued April 4, 1950.

As has been discussed in United States Patent No. 2,502,479, large-area contacts shown in the devices of Figs. 1, 2, 3 and 4 may be replaced by tapered conductivity regions showing less and less resistance as the electrode is approached. Such tapered regions may be made according to the disclosure of my copending application Serial No. 256,791, filed November 16, 1951.

Although this invention has been described and illustrated in terms of devices containing four electrodes, it is not intended that the scope of this invention be so limited. Introduction of additional emitter electrodes on any one of the bridge-type devices discussed renders these devices more flexible in that due to the disparity between transit times, the phase relationships are amenable to modification by proper selection of input terminals.

What is claimed is:

1. A semiconductor translating device comprising a body of semiconductive material containing a PN barrier, two low-resistance contacts to said body and at least two emitter contacts also to said body and intermediate said two low-resistance contacts.

2. A semiconductor translating device as described in claim 1 in which said at least two emitter contacts are on either side of and adjacent to said PN barrier.

3. A semiconductor translating device comprising a filament of semiconductive material, two low-resistance contacts to said filament intermediate which contacts is a filamentary section of said body, which filamentary section is part P-type and part N-type, and at least two emitter contacts intermediate said low-resistance contacts at least one of which emitter contacts is substantially adjacent each low-resistance contact and in which there is a PN barrier intermediate said at least two emitter contacts.

References Cited in the file of this patent

UNITED STATES PATENTS

| | | |
|---|---|---|
| 2,476,323 | Rack | July 19, 1949 |
| 2,570,978 | Pfann | Oct. 9, 1951 |
| 2,595,497 | Webster | May 6, 1952 |
| 2,600,500 | Haynes et al. | June 17, 1952 |
| 2,623,103 | Kircher | Dec. 23, 1952 |
| 2,680,159 | Grover | June 1, 1954 |
| 2,691,736 | Haynes | Oct. 12, 1954 |